(12) United States Patent
Taniguchi

(10) Patent No.: US 6,489,863 B2
(45) Date of Patent: Dec. 3, 2002

(54) SURFACE ACOUSTIC WAVE DEVICE, SURFACE ACOUSTIC WAVE FILTER, AND MANUFACTURING METHOD FOR THE SURFACE ACOUSTIC WAVE DEVICE

(75) Inventor: Norio Taniguchi, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/761,315

(22) Filed: Jan. 17, 2001

(65) Prior Publication Data
US 2001/0008387 A1 Jul. 19, 2001

(30) Foreign Application Priority Data
Jan. 18, 2000 (JP) ........................................ 2000-009103

(51) Int. Cl.$^7$ ................................................. H03H 9/64
(52) U.S. Cl. .................. 333/193; 333/195; 310/313 B; 310/359
(58) Field of Search ................................ 333/191, 187, 333/186, 188, 193, 194, 195, 196; 310/313 R, 313 B, 357, 369, 359

(56) References Cited

U.S. PATENT DOCUMENTS 5,576,590 A * 11/1996 Ohnishi et al. .............. 310/359

FOREIGN PATENT DOCUMENTS

| JP | 5-75378 | | 3/1993 | ............ H03H/9/25 |
| JP | 6-6172 | * | 1/1994 | ............ H03H/9/25 |
| JP | 7-283688 | | 10/1995 | ............ H03H/9/04 |
| JP | 8-65089 | | 3/1996 | .......... H03H/9/145 |
| JP | 9-321572 | | 12/1997 | ............ H03H/9/42 |
| JP | 10-276059 | * | 10/1998 | ............ H03H/9/25 |
| JP | 10-276060 | | 10/1998 | ............ H03H/9/25 |

* cited by examiner

Primary Examiner—Robert Pascal
Assistant Examiner—Dean Takaoka
(74) Attorney, Agent, or Firm—Keating & Bennett, LLP

(57) ABSTRACT

A surface acoustic wave device includes a piezoelectric substrate made of LiTaO$_3$ and at least one interdigital transducer provided on the substrate and having a plurality of electrode fingers. The polarization direction in at least one gap portion between electrode fingers of the at least one interdigital transducer is different from the polarization direction in other gap portions between electrode fingers on the same propagation path.

20 Claims, 14 Drawing Sheets

SURFACE ACOUSTIC WAVE DEVICE, SURFACE ACOUSTIC WAVE FILTER, AND MANUFACTURING METHOD FOR THE SURFACE ACOUSTIC WAVE DEVICE

BACKGROUND OF THE INVENTION

1. Field of the Invention

The present invention relates to a surface acoustic wave device to be used as, for example, a resonator and a bandpass filter, a surface acoustic wave filter, and a manufacturing method for the surface acoustic wave device.

2. Description of the Related Art

In recent years, in portable telephone systems, with the increase of subscribers and diversified services, each of the frequency bands for transmission and reception has been broadened and the transmission frequencies and reception frequencies have come close to each other. Accordingly, in the bandpass filters to be used in portable telephones, it is required that the filters are broadband and that the attenuation characteristics in the vicinity of passbands are superior. When EGSM as a portable telephone system in Europe is taken as an example, the transmission side frequency band is 880 MHz to 915 MHz and the reception side frequency band is 925 MHz to 960 MHz.

Transmission signals become noise in reception side circuits. Accordingly, in the bandpass filters to be used in reception side circuits, it is necessary to make signals pass through in the band of 925 MHz to 960 MHz and to attenuate signals in the band of 880 MHz to 915 MHz. That is, the filtering characteristics having 925 MHz to 960 MHz as a passband and 880 MHz to 915 MHz as an attenuation band are required. As a result, although the pass bandwidth is required to have a broad band of 35 MHz, the frequency difference between the passband and the attenuation band is only 10 MHz.

On the other hand, in the surface acoustic wave filters used as a bandpass filter in the portable telephones, a 36° LiTaO$_3$ substrate is used. As for this substrate, a temperature dependence of frequency is as large as −30 ppm/° C. to 35 ppm/° C. As a result, it is necessary to provide a margin of temperature change in designing circuits including surface wave devices.

Furthermore, when frequency variations during manufacture are taken into consideration, the frequency spacing between the passband and the attenuation band becomes much narrower. Therefore, it is more important to increase the steepness of the filtering characteristic in the vicinity of the passband.

The bandwidth of a surface acoustic wave filter and the steepness in the vicinity of the passband are nearly uniquely fixed by the electromechanical coupling coefficient of a piezoelectric substrate. Generally, when the electromechanical coupling coefficient is large, broadband filtering characteristics can be obtained, and when the electromechanical coupling coefficient is small, filtering characteristics having superior steepness can be obtained.

Accordingly, when piezoelectric substrates having different electromechanical coupling coefficients are used according to elements in surface acoustic wave filters, steep and relatively broadband filtering characteristics can be obtained in accordance with these combinations.

In Japanese Unexamined Patent Application No. 7-283688, a method for adjusting electromechanical coupling coefficients is performed in such a way that in a surface acoustic wave filter of a ladder-type circuit construction, the surface wave propagation direction in a series-arm resonator is made different from that in a parallel-arm resonator. In a 36° Y-cut LiTaO$_3$ substrate, the electromechanical coupling coefficient is dependent on the surface wave propagation direction. When the surface wave propagation direction is supposed to be directed along the X axis, the electromechanical coupling coefficient becomes maximum, and when the surface wave propagation direction is deviated from the X axis, the electromechanical coupling coefficient becomes smaller. Accordingly, for example, in a surface acoustic wave filter having a ladder-type circuit construction, when the propagation direction in the series-arm resonator is directed along the X axis and the propagation axis in the parallel-arm resonator is deviated from the X axis, as shown in FIG. 14, the spacing between a resonant frequency and antiresonant frequency in the resonance characteristic A of the parallel-arm resonator is narrowed compared with the characteristic (shown by broken line Aa) of the case where the propagation direction of the parallel-arm resonator is not deviated from the X axis and compared with the resonance characteristic B of the series-arm resonator. Accordingly, a filtering characteristic having superior steepness can be obtained as shown by broken line in FIG. 15. Moreover, in FIG. 15, the solid line D shows the characteristic where the surface wave propagation direction is not different in the series-arm resonator and parallel-arm resonator.

On the other hand, in Japanese Unexamined Patent Application Publication No. 8-65089, a method for adding capacitance to each resonator in a surface acoustic wave filter of a ladder-type circuit construction is disclosed. When capacitance is added in parallel to a surface acoustic wave resonator, an antiresonant frequency is decreased and the spacing between a resonant frequency and antiresonant frequency is narrowed in the same way as in the case of the method disclosed in Japanese Unexamined Patent Application Publication No. 7-283688. Accordingly, it is supposed that a filtering characteristic having superior steepness can be obtained.

However, in the surface acoustic wave filters disclosed in Japanese Unexamined Patent Application Publication No. 7-283699 and Japanese Unexamined Patent Application Publication No. 8-65089, there were various problems.

For example, in the former, there was a problem that, when the propagation direction of a surface wave is deviated from the X axis in a 36° Y-cut LiTaO$_3$ substrate, the power flow angle as an angular difference between the direction of travel of the surface wave and the direction of the energy transfer increases, the leakage of energy from the waveguide increases, and the loss increases. Furthermore, since it is necessary to provide a plurality of surface acoustic wave resonators having different propagation directions on the same piezoelectric resonator, the size of a surface acoustic wave filter is greatly increased. Furthermore, there were cases that different resonators are acoustically partially coupled and because of the coupling the characteristics become deteriorated.

On the other hand, in the method described in Japanese Unexamined Patent Application Publication No. 8-65089, in order to add capacitance, the chip size was greatly increased. Furthermore, because the filtering characteristics cannot be changed after the electrodes have been formed, the frequency could not be adjusted.

SUMMARY OF THE INVENTION

In order to overcome the problems described above, preferred embodiments of the present invention provide a surface acoustic wave device in which the above-mentioned drawbacks of the prior art are solved and without causing a larger size, increased loss, and deteriorated characteristics, such that the steepness in the vicinity of the passband is superior when used as a bandpass filter, and provide a manufacturing method for such a surface acoustic wave device.

Other preferred embodiments of the present invention provide a surface acoustic wave filter which is characterized by low loss, excellent filtering characteristics, very small size, and superior steepness in the vicinity of the passband.

According to a preferred embodiment of the present invention, a surface acoustic wave device includes a piezoelectric substrate made of $LiTaO_3$, and at least one interdigital transducer disposed on the substrate and having a plurality of electrode fingers. The polarization direction in at least one gap portion between electrode fingers of the at least one interdigital transducer is different from the polarization direction in other gap portions between electrode fingers on the same propagation path.

According to the unique structure and arrangement of this preferred embodiment of the present invention, the electromechanical coupling coefficient is greatly reduced compared with the case where the polarization direction of all the gap portions in the interdigital transducer is the same. Thus, a frequency spacing between a resonant frequency and an antiresonant frequency is greatly narrowed and, when used as a surface acoustic wave filter, the steepness in the vicinity of the passband is greatly increased.

In the surface acoustic wave device, the electrode fingers of the at least one interdigital transducer may be withdrawn so that the electromechanical coupling coefficient is reduced by the withdrawing. In this case, the spacing between a resonant frequency and an antiresonant frequency can be much more reduced, and, when used as a surface acoustic wave filter, the steepness of filtering characteristics in the vicinity of the passband can be much more increased.

According to another preferred embodiment of the present invention, a surface acoustic wave filter preferably includes a piezoelectric substrate, and a plurality of one-port surface acoustic wave elements each having an interdigital transducer which is disposed on the piezoelectric substrate. The plurality of one-port surface acoustic wave elements are arranged to define a ladder-type circuit having at least one parallel-arm resonator and at least one series-arm resonator. The polarization direction in at least one gap portion between electrode fingers in the interdigital transducer of one of the one-port surface acoustic wave elements is different from the polarization direction in other gap portions between the electrode fingers.

According to still another preferred embodiment of present invention, a surface acoustic wave resonator filter includes a piezoelectric substrate, and a plurality of interdigital transducers provided on the piezoelectric substrate. The polarization direction in at least one gap portion between electrode fingers in the interdigital transducer of one of the one-port surface acoustic wave elements is different from the polarization direction in other gap portions between the electrode fingers.

According to these unique structures and arrangements, the frequency spacing between a resonant frequency and an antiresonant frequency is narrowed in the at least one surface acoustic wave element. Accordingly, the steepness in the vicinity of the passband of the surface acoustic wave filter is greatly increased.

For example, in a parallel-arm resonator, when the polarization direction in at least one gap portion is different from the polarization direction in other gap portions as described above, the resonant frequency is increased in the parallel-arm resonator and the steepness of the filtering characteristic on the lower frequency side of the passband is increased. Furthermore, in a series-arm resonator, when the polarization direction in gap portions is different from each other as described above, the steepness on the higher frequency side of the passband of a surface acoustic wave filter is greatly increased.

In the filters, a portion of the electrode fingers of the at least one interdigital transducer may be withdrawn. Alternatively, the propagation direction of a surface acoustic wave in at least one of the interdigital transducers may be different from the propagation direction of other interdigital transducers.

In this case, the electromechanical coupling coefficient of the surface acoustic wave device is substantially decreased by the thinning-out process, and the steepness of filtering characteristics can be more effectively increased.

The manufacturing method for a surface acoustic wave device including a piezoelectric substrate and at least one interdigital transducer provided on the substrate and having a plurality of electrode fingers preferably includes the steps of forming at least one of the interdigital transducers on the piezoelectric substrate and applying a DC voltage so that an electric field strength of about 50 V/$\mu$m or more is applied to the at least one interdigital transducer. In the case, frequency adjustment may also performed by applying the DC voltage.

For the purpose of illustrating the invention, there are shown in the drawings several forms that are presently preferred, it being understood, however, that the invention is not limited to the precise arrangements and instrumentalities shown.

Other elements, features, characteristics and advantages of the present invention will become more apparent from the following detailed description of preferred embodiments thereof with reference to the attached drawings.

DETAILED DESCRIPTION OF PREFERRED EMBODIMENTS

The inventors of the present invention have discovered that when a DC voltage is applied across a pair of comb-shaped electrodes constituting an interdigital transducer so as to apply an electric field strength of about 50 V/$\mu$m or more therebetween, the electromechanical coupling coefficient can be substantially changed. According to this method, a surface acoustic wave filter having a small size can be realized without allowing the loss to increase. This principle is illustrated with reference to FIGS. 1 and 2.

Figure 1:
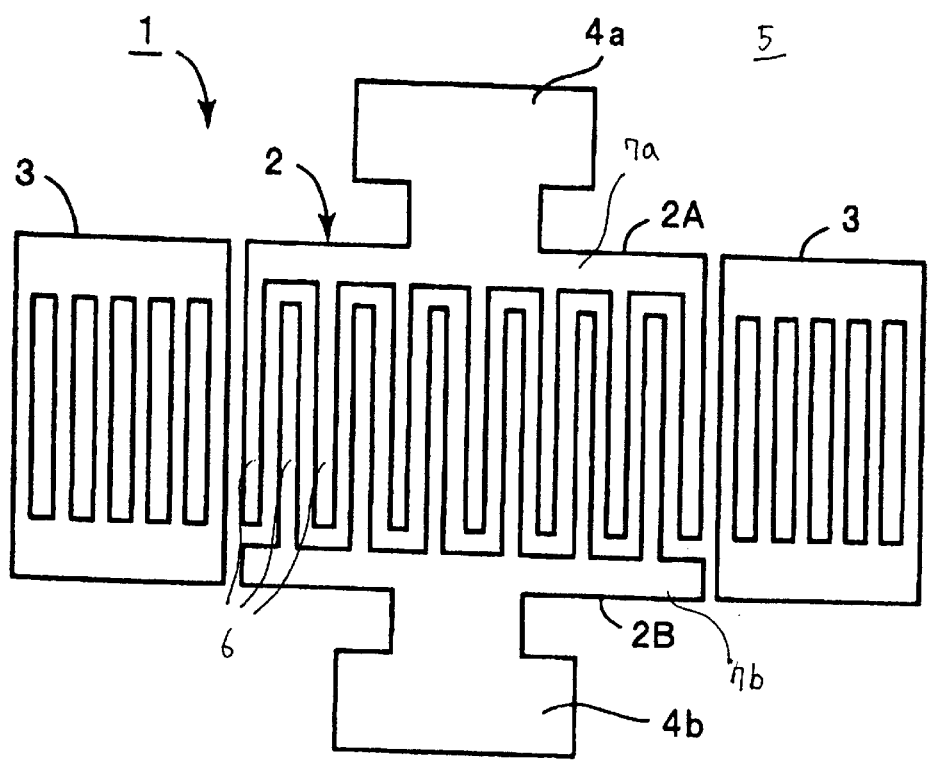
FIG. 1 is a top view showing the construction of electrodes in a one-port surface acoustic wave resonator included in a first preferred embodiment of the present invention.

FIG. 1 shows a basic structure of a surface acoustic wave resonator 1 used in preferred embodiments of the present invention. The surface acoustic wave resonator 1 preferably includes an interdigital transducer 2 and a pair of reflectors 3 disposed on a piezoelectric substrate 5. The pair of reflectors 3 are located on both sides of the interdigital transducer 2. The pair of reflectors 3 may be omitted, depending on the required resonator characteristics. The interdigital transducer includes a plurality of electrode fingers 6. The plurality of electrode fingers 6 are connected to bus bars 7a and 7b alternately, thereby respectively forming a comb-shaped electrodes 2A and 2B that are interdigitated with each other. Pads 4a and 4b are connected to the bas bars 7a and 7b.

Figure 2:
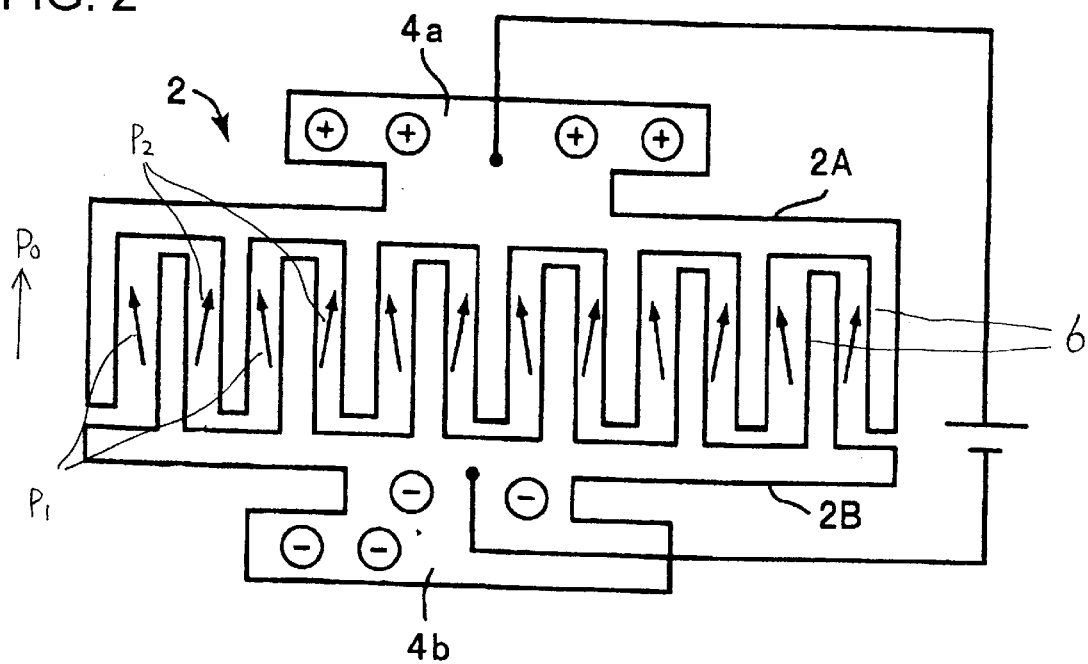
FIG. 2 is a schematic top view for illustrating the polarization direction in the gap between electrode fingers when a DC voltage is applied to an interdigital transducer in a first preferred embodiment of the present invention.

In the above-described surface acoustic wave resonator 1, when a DC voltage is applied between the electrode pads 4a and 4b by making probes contact the electrode pads 4a and 4b, a DC voltage is applied to the gaps between electrode fingers 6 of the interdigital transducer 2 and the polarization direction of the substrate is changed at the gap regions, as shown in FIG. 2.

In the case where the substrate 5 is a 36° Y-cut X-propagation LiTaO$_3$ substrate, a component of the polarization direction on the surface of the substrate is substantially perpendicular to the propagation direction of a surface wave and is substantially parallel to the extending direction of the electrode fingers 6, as indicated by arrow P$_0$. The polarization direction is the same over the entire 36° Y-cut X-propagation LiTaO$_3$ substrate 5.

After the interdigital transducer 2 has been formed on the substrate 5, when a high electric field strength of about 50 V/$\mu$m or more is applied between the comb-shaped electrodes 2A and 2B, the polarization direction is changed at the gap regions between the electrode fingers 6 such that the polarization direction at the gap regions between electrode fingers 6 is alternately deviated as indicated by arrows P$_1$ and P$_2$ from the original polarization direction P$_0$. That is, the polarization direction of the piezoelectric substrate 5 in the gap regions between electrode fingers 6 is different from that in the region where the interdigital transducer 2 is not provided. When the polarization direction deviates in such a way, the piezoelectric constant and the elastic constant are varied, and the electromechanical coupling coefficient also changes.

Figure 3:
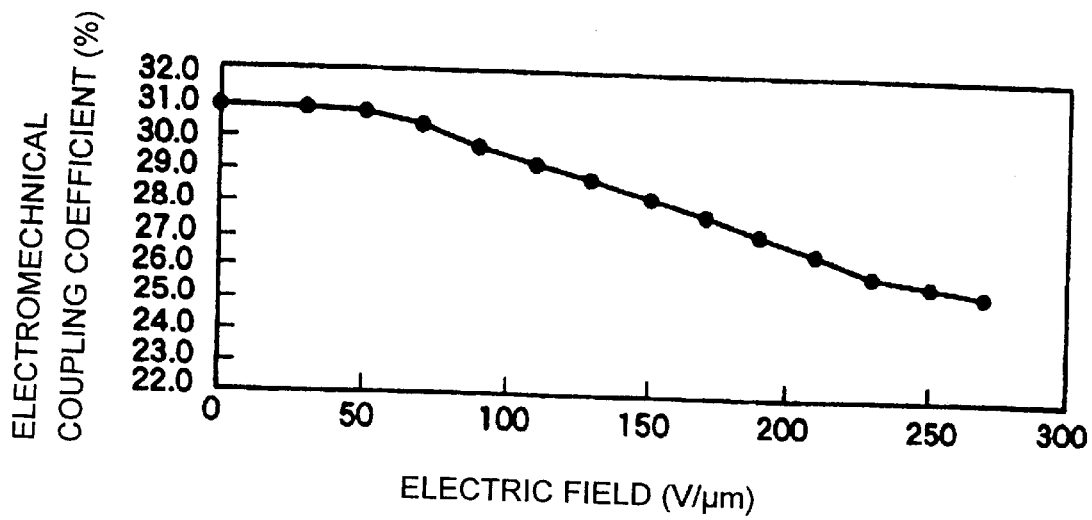
FIG. 3 shows the relationship between an electric field strength and an electromechanical coupling coefficient when a DC voltage is applied to an interdigital transducer.

Here, the relationship between the electric field strength applied to an interdigital transducer and the electromechanical coupling coefficient is shown in FIG. 3.

The electric field strength is shown in the applied voltage/gap length of interdigital transducer. As clearly seen in FIG. 3, when the electric field strength is about 50 V/$\mu$m or less, the electromechanical coupling coefficient hardly changes. Therefore, it is understood that the electric field strength of about 50 V/$\mu$m or more is required in order to control the electromechanical coupling coefficient.

Furthermore, the electric field strength of about 300 V/$\mu$m or more is too high and there is the possibility that the interdigital transducer itself may break down. Therefore, practically it is desirable to set the electric field strength about 300 V/$\mu$m or less, but because the possibility of breakdown changes due to the construction of interdigital transducers and the insulation resistance the upper limit is not particularly defined.

It is to be noted that Japanese Unexamined Patent Application Publication No. 5-75378, discloses that when a piezoelectric substrate such as quartz, or other suitable material, is used, distortion is caused in the piezoelectric substrate by application of a DC voltage to an interdigital transducer and the piezoelectric constant, and other characteristics change. However, in the method described in this prior art, when the application of a DC voltage is stopped, the piezoelectric constant returns to the original value. In this prior art, by making use of the change of a DC voltage through this effect a voltage-controlled type oscillator is constructed.

On the other hand, in the case of a LiTaO$_3$ substrate, the polarization direction changes by application of a voltage as described above, and the properties themselves change and do not return to the original value. That is, once a large DC electric field is applied as described above, even if the application of the voltage has been stopped, the changed properties of the material are kept as they are. Therefore, by application of a predetermined voltage, the constant of a piezoelectric substrate material can be freely changed and as a result, it is possible to increase the steepness of the filtering characteristics and control the bandwidth.

Furthermore, as described above, when an applied voltage is too high, an interdigital transducer itself may break down, and accordingly, it is difficult to reduce the electromechanical coupling coefficient beyond a certain limit. In that case, by reducing the electromechanical coupling coefficient to a certain extent by other methods such as a method of withdrawal weighting, a method of making the propagation direction of a surface wave different, or other suitable methods, a much more advantageous effect can be obtained.

Figure 4:
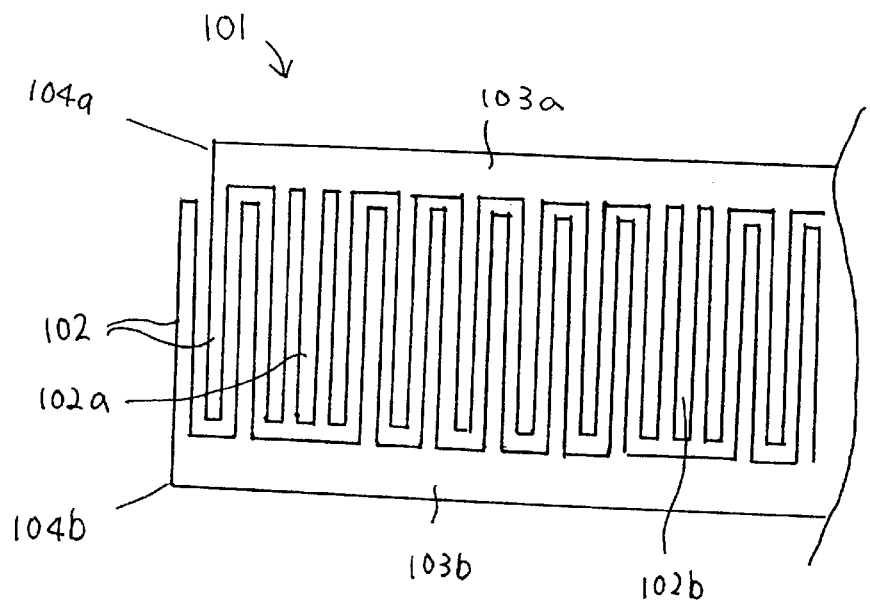
FIG. 4 shows an interdigital transducer in which electrode fingers are withdrawn.

More specifically, FIG. 4 shows one example of an interdigital transducer 101 in which a method of withdrawal weighting is applied. The interdigital transducer 101 includes a plurality of electrode fingers 102 which are alternately connected to bus bars 103a and 103b from a pair of comb-shaped electrodes 104a and 104b except the electrode fingers 102a and 102b. The electrode fingers 102a and 102b are normally to be connected to the bus bar 103b but are electrically disconnected from the bus bar 103a, whereby the electrode fingers 102a and 102b are withdrawn. The electrode fingers 102a and 102b are connected to the bus bar 103a as dummy electrodes, but this is not necessary. By the withdrawal weighting method, a surface acoustic wave resonator including the interdigital transducer 101 has a smaller electromechanical coupling coefficient.

Figure 5:
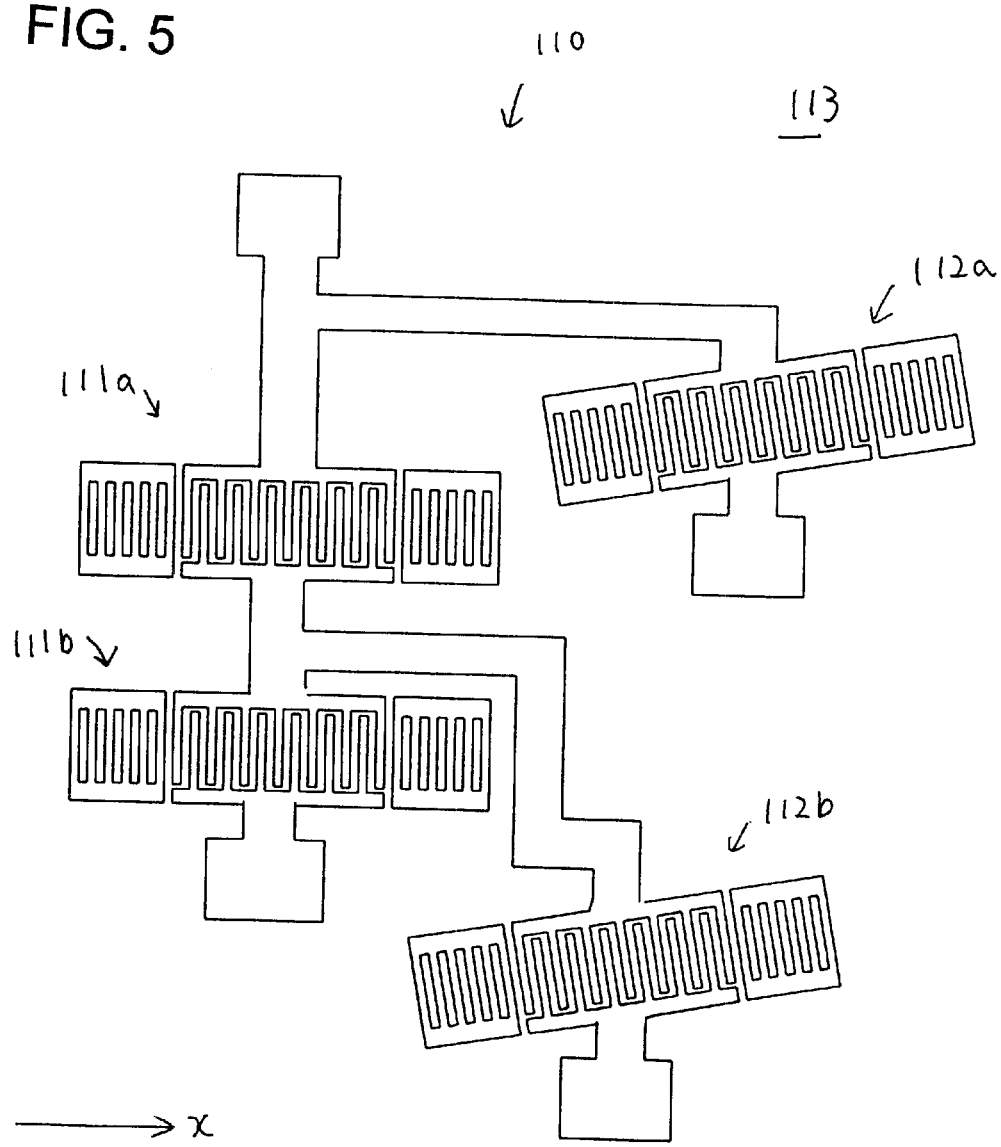
FIG. 5 shows surface acoustic wave filter in the propagation direction of some resonators is different from others.

FIG. 5 shows an example of method of making the propagation direction of a surface wave different. A surface acoustic wave filter 110 includes series arm resonators 111a and 111b and parallel arm resonators 112a and 112b on a piezoelectric substrate 113. The series arm resonators 111a and 111b are disposed on the piezoelectric substrate such that a direction in which the surface acoustic wave propagates are aligned is substantially parallel to the x direction as shown in FIG. 5. On the other hand, the parallel arm resonators 112a and 112b are disposed on the piezoelectric substrate such that a direction in which the surface acoustic wave propagates intersects the x direction. As a result, the electromechanical coupling coefficients of the parallel arm resonators 112a and 112b are different from those of the series arm resonators 111a and 111b.

Hereinafter, with reference to the drawings, preferred embodiments of the present invention will be described in more detail.

Figure 6:
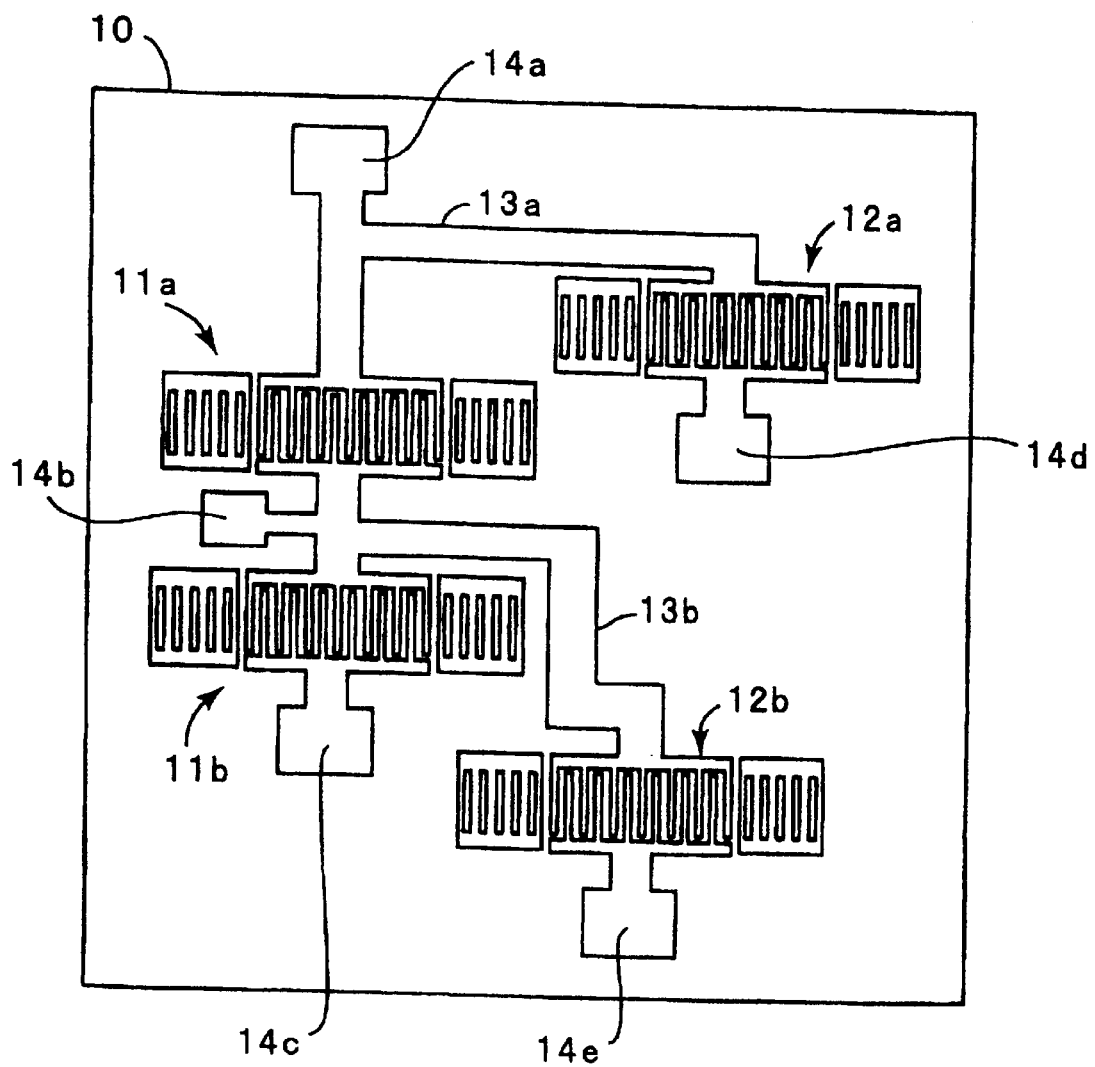
FIG. 6 is a top view of a surface acoustic wave filter of the first preferred embodiment of the present invention.

FIG. 6 is a typical top view showing a surface acoustic wave filter as a surface acoustic wave device according to a first preferred embodiment of the present invention.

In the surface acoustic wave device of the present preferred embodiment, on a 36° Y-cut X-propagation LiTaO$_3$ substrate 10, two series-arm resonators 11a and 11b, two parallel-arm resonators 12a and 12b, wiring electrodes 13a and 13b, and electrode pads 14a to 14e are formed by photolithography and etching, or others suitable processes. As an electrode material for forming these elements, aluminum is preferably used, but they can be constructed by using an appropriate metal.

Each of the above series-arm resonators 11a and 11b and parallel-arm resonators 12a and 12b is preferably a one-port surface acoustic wave resonator where reflectors are disposed on both sides in the surface wave propagation direction of a interdigital transducer. Furthermore, the wiring electrode 13a connects the electrode pad 14a, the series-arm resonator 11a, and the parallel-arm resonator 12a. The end portion of the parallel-arm resonator 12a, which is opposite to the side electrically connected to the wiring electrode 13a, is joined to the electrode pad 14d. Furthermore, the wiring electrode 13b connects the end portion, which is opposite to the side connected to the wiring electrode 13a, of the series-arm resonator 11a, the series-arm resonator 14c, the parallel-arm resonator 12b, and the electrode pad 14b.

The end portion of the series-arm resonator 11b, which is opposite to the side connected to the wiring electrode 13b, is joined to the electrode pad 14c. In the same way, the end portion of the parallel-arm resonator 12b, which is opposite to the side connected to the wiring electrode 13b, is linked to the electrode pad 14e.

In the interdigital transducer of the series-arm resonator 11a, the crossing width is about 40 $\mu$m, a number of pairs of electrode fingers is 90, a number of electrode fingers in the reflector is 100, and a pitch of the electrode fingers in the interdigital transducer and the electrode fingers of the reflectors is about 2.05 $\mu$m (the wavelength of the surface acoustic wave is about 4.1 $\mu$m).

The cross width of the electrode fingers of the interdigital transducer of the series-arm resonator 11b is about 80 $\mu$m, a number of pairs of electrode fingers is 90, a number of electrode fingers in the reflector is 100, and a pitch of the electrode fingers in the interdigital transducer and the electrode fingers of the reflectors is about 2.05 $\mu$m (the wavelength of the surface acoustic wave is about 4.1 $\mu$m).

The cross width of the interdigital transducer of the parallel-arm resonator 12a is about 80 $\mu$m, a number of pairs of electrode fingers is 60, a number of electrode fingers of one reflector is 100, and a pitch of the electrode fingers in the interdigital transducer and the reflectors is about 2.15 $\mu$m (the wavelength of the surface acoustic wave is about 4.3 $\mu$m).

The cross width of the interdigital transducer of the parallel-arm resonator 12b is about 120 $\mu$m, a number of pairs of electrode fingers is 90, a number of electrode fingers of one reflector is 100, and a pitch of the electrode fingers in the interdigital transducer and the reflectors is about 2.15 $\mu$m (the wavelength of the surface acoustic wave is about 4.3 $\mu$m).

Moreover, in FIG. 4, the resonators are schematically illustrated, and it must be noted that a number of pairs of electrode fingers and the ratio between the cross widths are actually different from the drawing.

Figure 7:
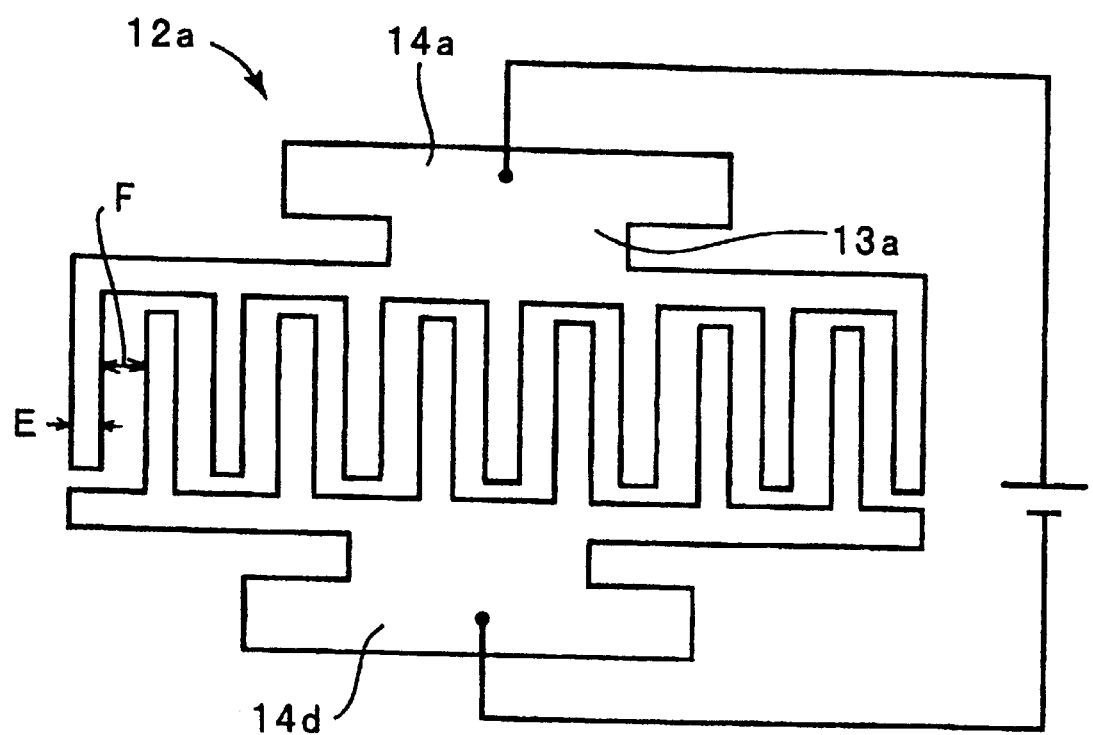
FIG. 7 is a typical enlarged top view showing the construction of electrodes in an interdigital transducer of a parallel-arm resonator used in the first preferred embodiment of the present invention.

After each of the above electrodes has been formed, a DC voltage of about 180 V is applied between the electrode pads 14a and 14d and between the electrode pads 14b and 14e, and a voltage is applied to both of the parallel-arm resonators 12a and 12b. In FIG. 7, the process where a DC voltage is applied to the interdigital transducer of the parallel-arm resonator 12a is schematically illustrated. Moreover, in FIG. 5, the reflectors are omitted.

The width E of electrode fingers is about 1.15 $\mu$m, and the gap width F between neighboring electrode fingers is about 1.00 $\mu$m. Moreover, the gap width is defined as the dimension of the gap along the propagation direction of the surface wave. Accordingly, an electric field strength of about 180 V/$\mu$m is applied between adjacent electrode fingers. Moreover, when the above voltage is applied, the voltage may be gradually increased from a voltage where the portion of the interdigital transducer does not break down, and the electric field strength may be gradually increased from, for example, about 50 V/$\mu$m.

Figure 8:
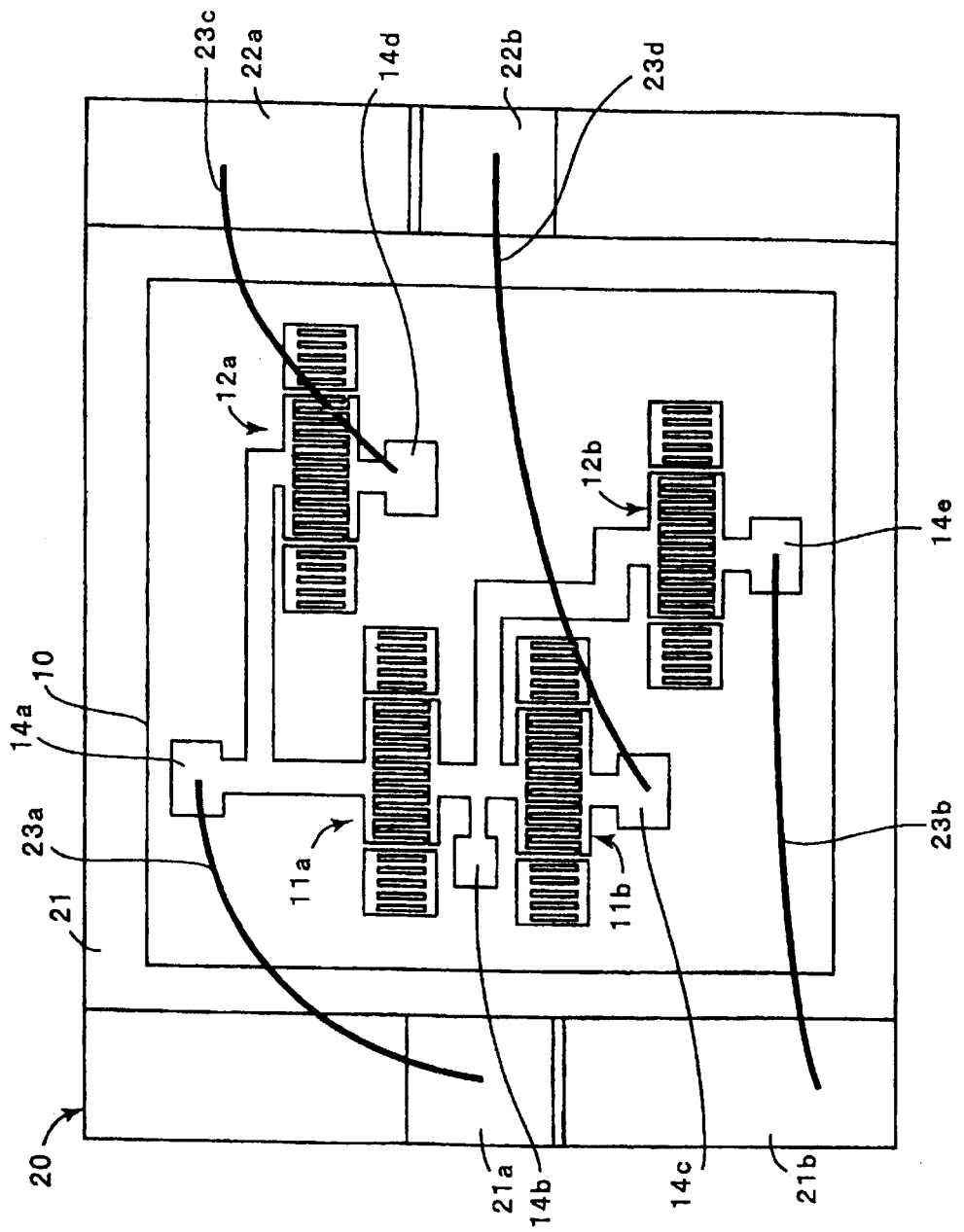
FIG. 8 is a top view for illustrating the state where a surface acoustic wave filter element of the first preferred embodiment is mounted in a package.

After that, the above piezoelectric substrate 10 is mounted in a ceramic package 20 shown in FIG. 8. The ceramic package 20 has a hollow portion 21 in the middle, and in the hollow portion, the above-described surface acoustic wave filter element is fixed. Then, around the hollow portion 21, a pair of protruded portions are provided, and on the upper surface of the protruded portions electrode pads 21a, 21b, 22a, and 22b are provided.

The electrode pad 21a and the electrode pad 14a of the surface acoustic wave filter element are electrically connected via a bonded wire 23a. Furthermore, the electrode pad 21b is electrically connected to the electrode pad 14e of the surface acoustic wave filter element via a bonded wire 23b. Furthermore, the electrode pad 22a is electrically connected to the electrode pad 14d of the surface acoustic wave filter element via a bonded wire 23c. Moreover, the electrode pad 22b is electrically connected to the electrode pad 14c of the surface acoustic wave filter element via a bonded wire 23d.

In the above-described ceramic package, the electrode pads 21a and 22b constitute hot terminals and the electrode pads 21b and 22a constitute ground terminals.

By joining a plate-like material so as to cover the hollow portion of the ceramic package 20, a surface acoustic wave filter device including a surface acoustic wave filter element is produced.

In the present preferred embodiment, before the surface acoustic wave filter element is mounted in the ceramic package 20, a DC voltage of about 180 V is applied to the parallel-arm resonator 12a as described above, by the application of the voltage the electromechanical coupling coefficient of parallel-arm resonator 12a can be substantially decreased, and the spacing between a resonant frequency and an antiresonant frequency is narrowed. This is described with reference to FIGS. 7 and 8.

Figure 9:
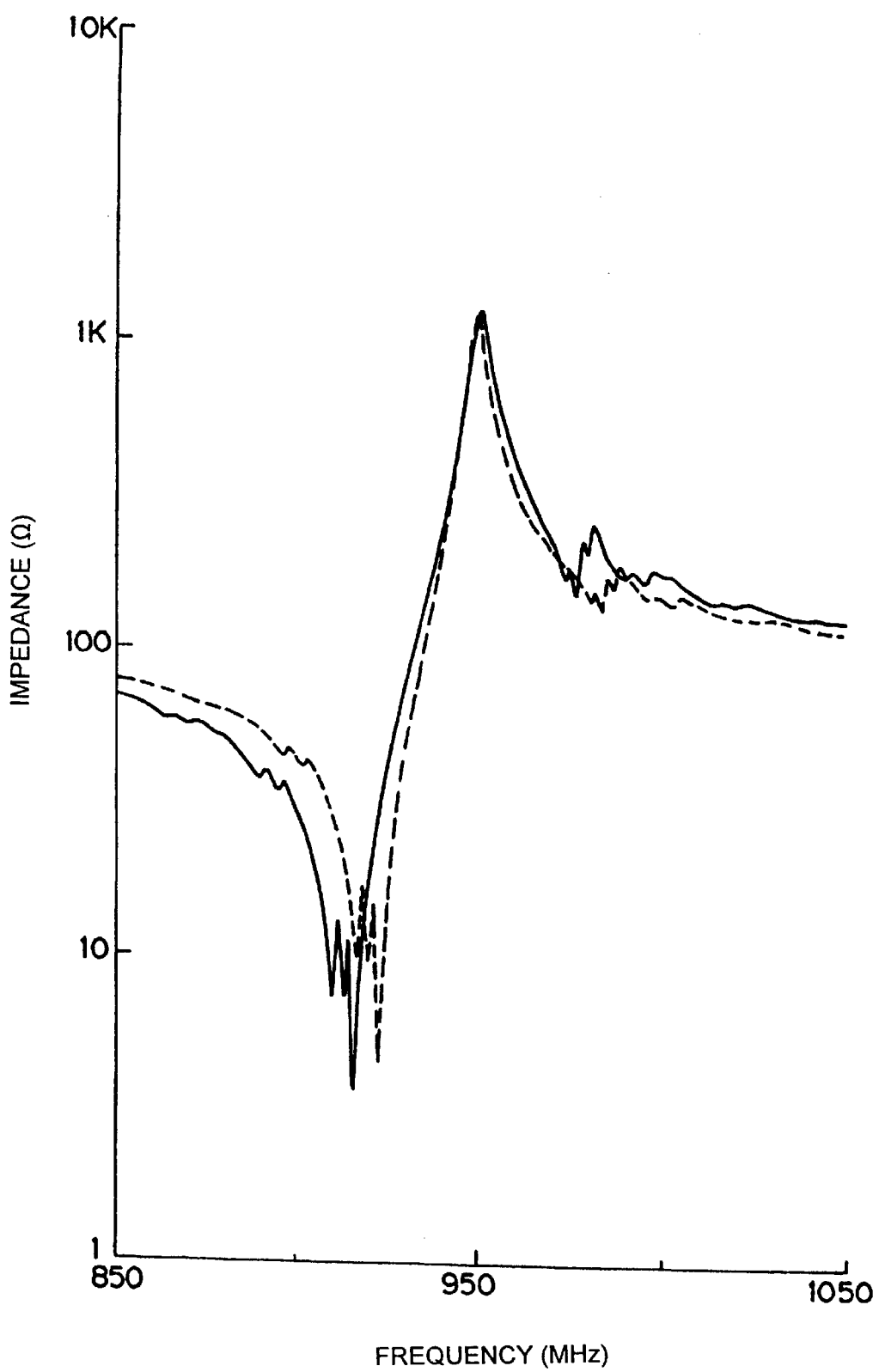
FIG. 9 shows the impedance-frequency characteristic (solid line) before a DC voltage is applied and the impedance-frequency characteristic (broken line) after a DC voltage has been applied to the parallel-arm resonator in a surface acoustic wave filter of the first preferred embodiment of the present invention.

FIG. 9 shows the impedance characteristic of only the parallel-arm resonator 12a shown in FIG. 4, the solid line shows the characteristic before the above voltage is applied, and the broken line shows the characteristic after the voltage was applied. As clearly seen when the characteristics of the solid line and the broken line are compared, by the application of the DC voltage, although the position of the antiresonant frequency is not shifted, the resonant frequency is increased, and it is understood that because of that the spacing of frequency between the resonant frequency and the antiresonant frequency is narrowed.

Figure 10:
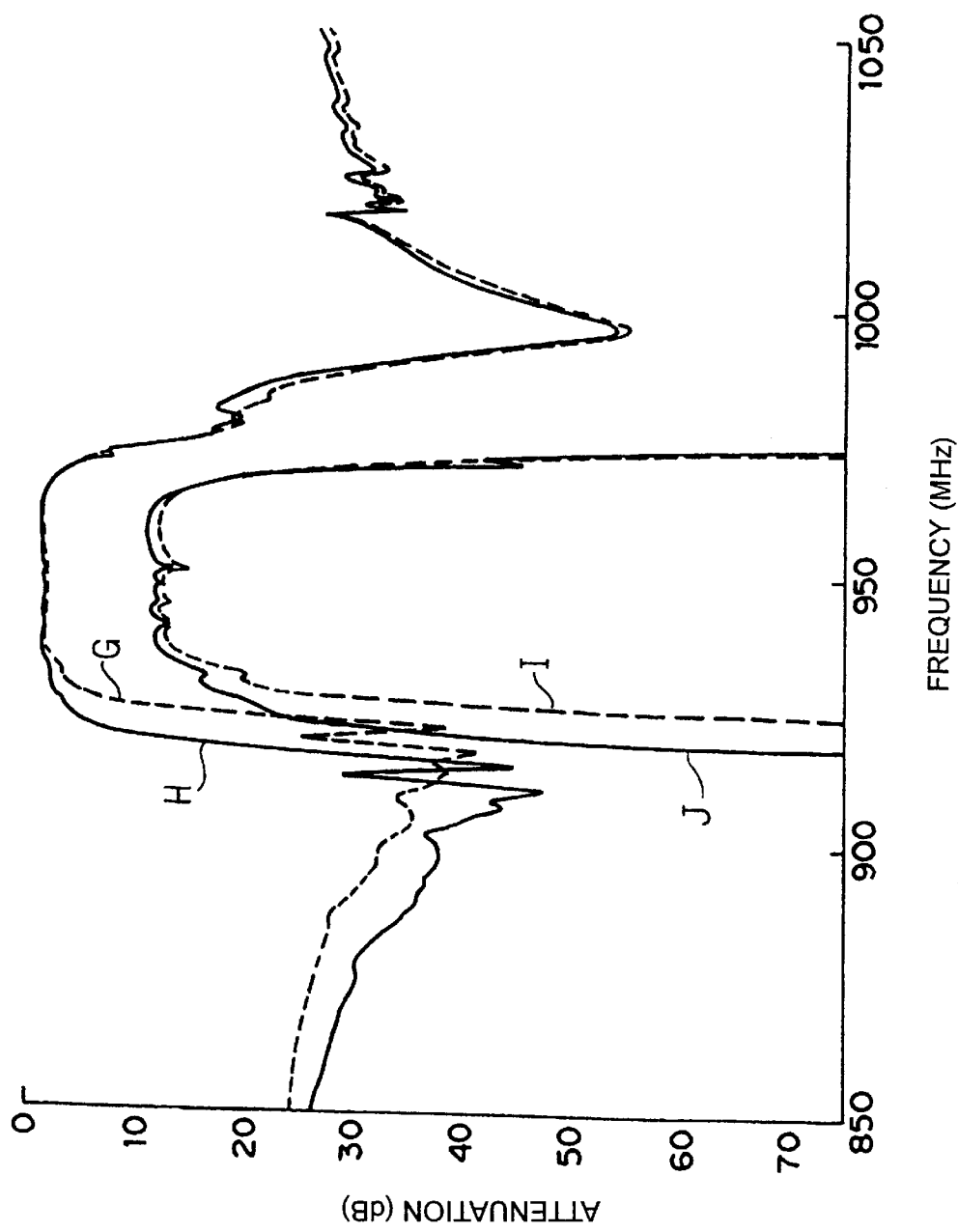
FIG. 10 shows the attenuation value-frequency characteristic (broken line) of a surface acoustic wave device of the first preferred embodiment and the attenuation value-frequency characteristic (solid line) of a surface acoustic wave filter constructed in the same way, except that a DC voltage has not been applied, which was prepared for comparison.

Furthermore, the frequency characteristic of the attenuation value of the surface acoustic wave filter device constructed as described above is shown by a broken line in FIG. 10. Moreover, the frequency characteristic of the attenuation value of the surface acoustic wave filter device constructed in the same way, except that the above DC voltage was not applied, is shown by a solid line in FIG. 10. Moreover, the broken line I and solid line J in FIG. 10 are those where the characteristics shown by the broken line G and solid line H are enlarged, respectively.

As clearly seen when the characteristics shown by the solid and broken lines in FIG. 8 are compared, because a DC voltage is applied to the parallel-arm resonator and the resonant frequency of the parallel-arm resonator 12a as a result of decrease in the electromechanical coupling coefficient is increased as described above, it is understood that in the frequency characteristic of the total filter the steepness on the lower frequency side of the passband is greatly increased. This is because, as shown in FIG. 1, a voltage is applied between electrode fingers and the gaps between electrode fingers is different from each other in the propagation direction of the surface wave.

Moreover, in the above-described preferred embodiment, a 36° Y-cut LiTaO$_3$ substrate was preferably used as a piezoelectric substrate, but even if a 36° to 46° Y-cut LiTaO$_3$ substrate having another cut angle is used, the same effect can be obtained. Furthermore, in the above preferred embodiment, the electrical connections between the ceramic package and the surface acoustic wave filter element were made by using the bonded wires, but the electrode pads of the package and the electrode pads of the surface acoustic wave filter element may be electrically connected by other electrically connecting elements and methods such as bump bonding and others.

Furthermore, as described above, by making use of the difference of the characteristics before and after the application of a DC voltage, the frequency adjustment can be also performed. In this case, before the voltage is applied, the electrical characteristic of the surface acoustic wave filter element having a ladder-type circuit construction is measured by using proving pins or other suitable elements. Then, by changing the applied voltage in the range of about 50 V/$\mu$m to about 300 V/$\mu$m, a desired frequency characteristic can be obtained.

However, because the frequency on the higher frequency side of the passband does not change, it is desirable to design a little wider passband in advance.

In the present preferred embodiment, the above DC voltage was applied to the surface acoustic wave filter element before the element is mounted in the ceramic package, but the DC voltage may be applied to the surface acoustic wave filter element after the element has been mounted in the ceramic package. However, since it is difficult to apply a voltage to a specific resonator on the piezoelectric substrate 10 selectively, it is desirable to forecast what voltage will be applied to each resonator beforehand and to design the electrodes in advance so as to obtain a desired characteristic after the application of the voltage.

Moreover, when the voltage is applied to all of the resonators, an excess current flows through unusual resonators so as to destroy them. Accordingly by application of the above voltage, a cleanup effect can be also expected.

Figure 11:
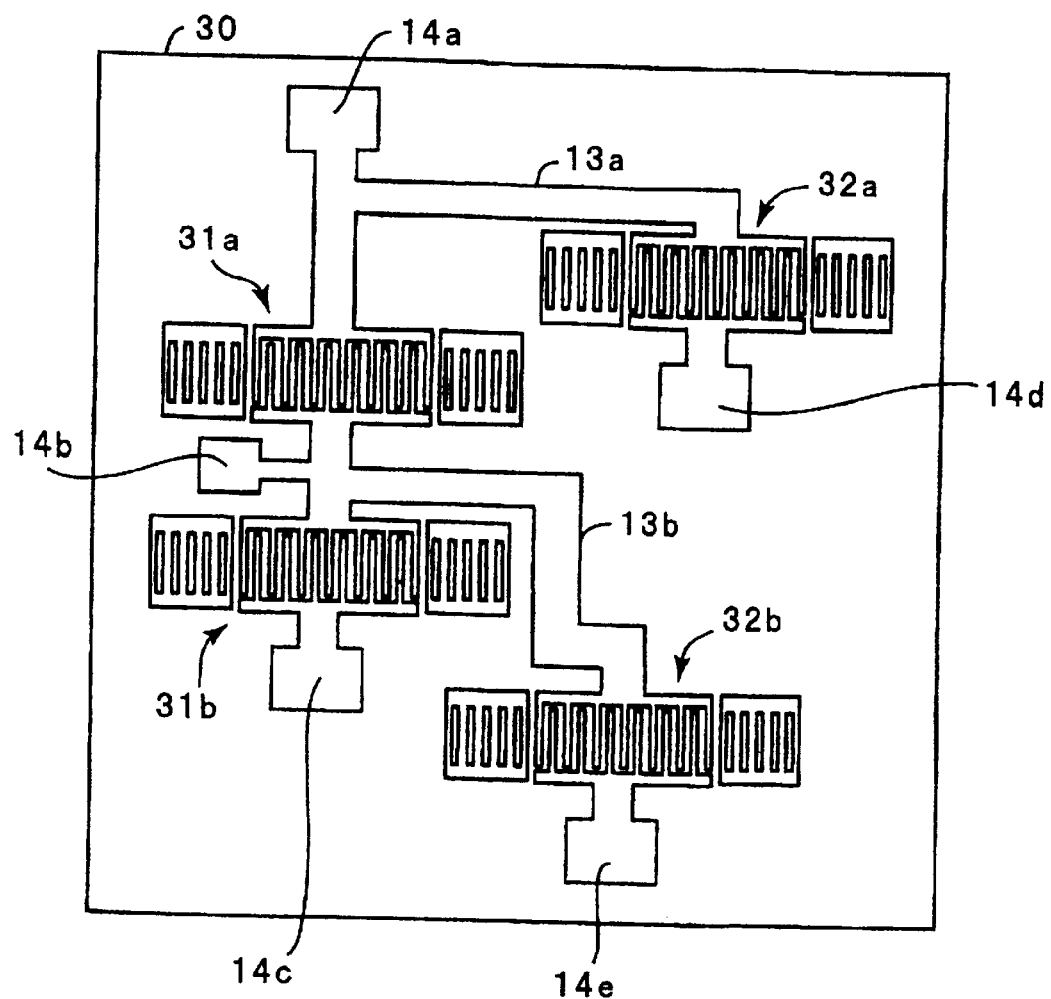
FIG. 11 is a top view for illustrating a surface acoustic wave filter according to a second preferred embodiment of the present invention.

FIG. 11 is a typical top view showing a surface acoustic wave filter as a surface acoustic wave device according to a second preferred embodiment of the present invention.

In the surface acoustic wave device of the present preferred embodiment, on a 46° Y-cut X-propagation LiTaO$_3$ substrate 30, two series-arm resonators 31a and 31b, two parallel-arm resonators 32a and 32b, wiring electrodes 13a and 13b, and electrode pads 14a to 14e are formed preferably by photolithography and etching. As an electrode material for forming these elements is preferably aluminum, but they can be constructed by using appropriate metal.

Each of the series-arm resonators 31a and 31b and parallel-arm resonators 32a and 32b preferably is a one-port surface acoustic wave resonator where reflectors are disposed on both sides in the surface wave propagation direction of a interdigital transducer. Furthermore, the wiring electrode 13a connects the electrode pad 14a, the series-arm resonator 31a, and the parallel-arm resonator 32a. The end portion of the parallel-arm resonator 32a, which is opposite to the side electrically connected to the wiring electrode 13a, is joined to the electrode pad 14d. Furthermore, the wiring electrode 13b connects the end portion, which is opposite to the side connected to the wiring electrode 13a, of the parallel-arm resonator 31a, the series-arm resonator 34c, the parallel-arm resonator 32b, and the electrode pad 14b.

The end portion of the series arm-resonator 31b, which is opposite to the side connected to the wiring electrode 13b, is joined to the electrode pad 14c. In the same way, the end portion of the parallel-arm resonator 32b, which is opposite to the side connected to the wiring electrode 13b, is linked to the electrode pad 14e.

In the interdigital transducer of the series-arm resonator 31a, the cross width is about 20 µm, a number of pairs of electrode fingers is 90, a number of electrode fingers in the reflector is 100, and a pitch of the electrode fingers in the interdigital transducer and the electrode fingers of the reflectors is about 1.04 µm (the wavelength of the surface acoustic wave is about 2.08 µm).

The cross width of the electrode fingers of the interdigital transducer of the series-arm resonator 11b is about 40 µm, a number of pairs of electrode fingers is 90, a number of electrode fingers in the reflectors is 100, and a pitch of the electrode fingers in the interdigital transducer and the electrode fingers of the reflector is about 1.04 µm (the wavelength of the surface acoustic wave is about 2.08 µm).

The cross width of the electrode fingers of the interdigital transducer of the parallel-arm resonator 12a is about 40 µm, a number of pairs of electrode fingers is 60, a number of electrode fingers in one reflector is 100, and a pitch of the electrode fingers in the interdigital transducer and the electrode fingers of the reflector is about 1.08 µm (the wavelength of the surface acoustic wave is about 2.16 µm).

The cross width of the electrode fingers of the interdigital transducer of the parallel-arm resonator 12b is about 60 µm, a number of pairs of electrode fingers is 90, a number of electrode fingers in one reflector is 100, and a pitch of the electrode fingers in the interdigital transducer and the electrode fingers of the reflector is about 1.08 µm (the wavelength of the surface acoustic wave is about 2.16 µm).

Moreover, in FIG. 11, each of the resonators is schematically illustrated, although the number of pairs of electrode fingers and the ratio between the cross widths are actually different from the drawing.

After each of the above electrodes has been formed, a DC voltage of about 70 V is applied between the electrode pads 14a and 14b and between the electrode pads 14b and 14c, and a DC voltage of about 70 V is applied to both of the series-arm resonators 31a and 31b. In FIG. 10, the process where a DC voltage is applied to the interdigital transducer of the series-arm resonator 31a is schematically illustrated. Moreover, in FIG. 12, the reflectors are omitted.

The width E of electrode fingers is about 0.54 µm, and the gap width F between adjacent fingers is about 0.50 µm. Moreover, the gap width is defined as the dimension of the gap along the propagation direction of a surface wave. Therefore, an electric field strength of about 140 V/µm is applied between adjacent electrode fingers. Moreover, when the above voltage is applied, the voltage may be gradually increased from a voltage where the portion of the interdigital transducer does not break down.

After that, the above piezoelectric resonator 30 is mounted in a ceramic package 20 shown in FIG. 6, the electrode pads 21a, 21b, 22a, and 22b are connected to the electrode pads 14a to 14e in the same way as in the first preferred embodiment, and by joining a plate-like material so as to cover the hollow portion of the above ceramic package 20, a surface acoustic wave filter device including a surface acoustic wave filter element is produced.

In the present preferred embodiment, before the surface acoustic wave filter element is mounted in the ceramic package 20, a DC voltage of about 70 V is applied to the parallel-arm resonators as described above, by the application of the voltage the electromechanical coupling coefficient of the piezoelectric substrate 30 can be greatly reduced, and the spacing between a resonant frequency and an antiresonant frequency is narrowed. This is described with reference to FIG. 13.

The frequency characteristic of the attenuation value of the surface acoustic wave filter device constructed as described above is shown by a broken line in FIG. 13. Moreover, the frequency characteristic of the attenuation value of a surface acoustic wave filter device constructed in the same way, except that the above DC voltage was not applied, is shown by a solid line in FIG. 13. Moreover, the broken line M and solid line J in FIG. 13 are those where the characteristics shown by the broken line K and solid line L are enlarged, respectively.

Figure 13:
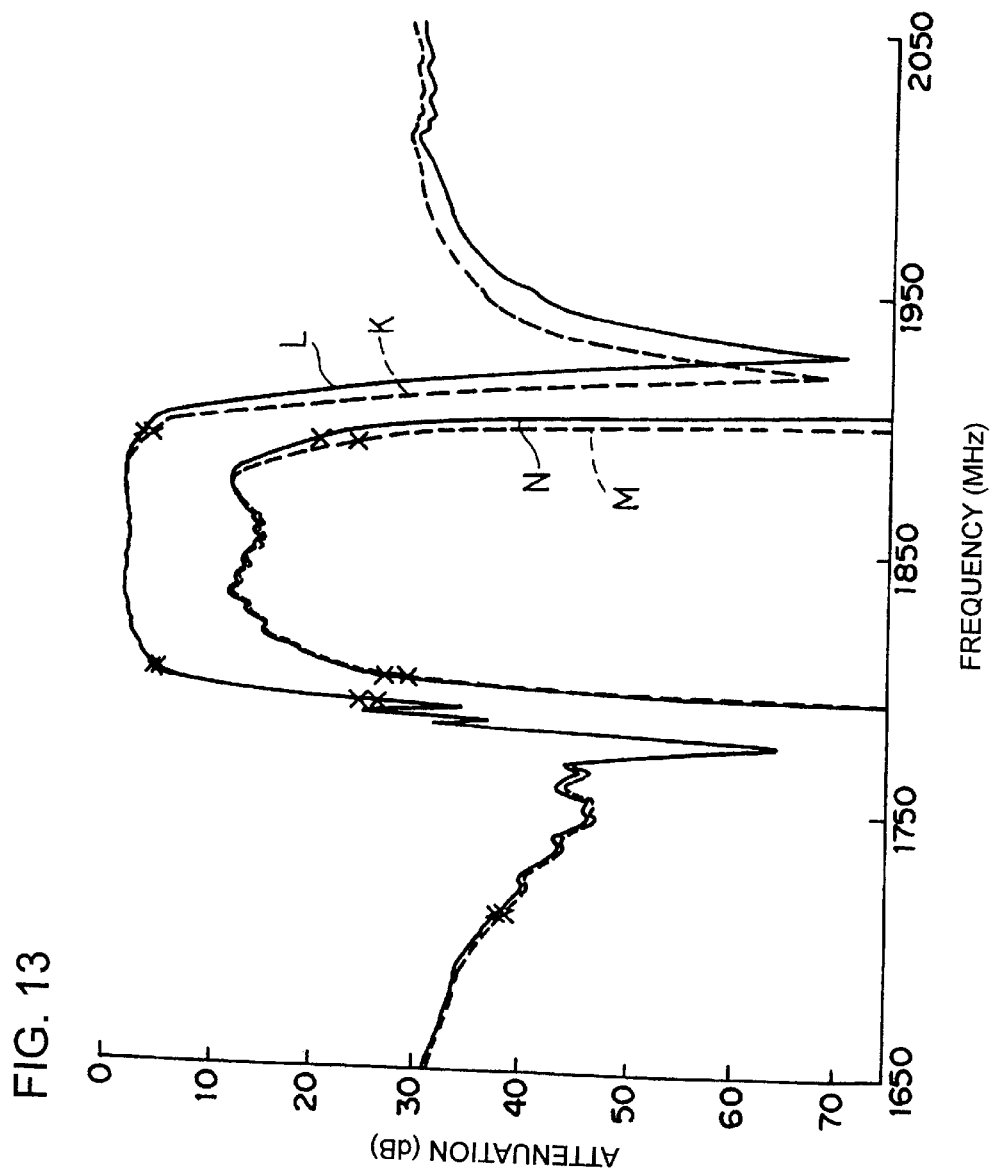
FIG. 13 shows the attenuation value-frequency characteristic (broken line) of a surface acoustic wave filter of the first preferred embodiment and the attenuation value-frequency characteristic (solid line) of a surface acoustic wave device constructed in the same way, except that a DC voltage has not been applied to a series-arm resonator, which was prepared for comparison.
Figure 14:
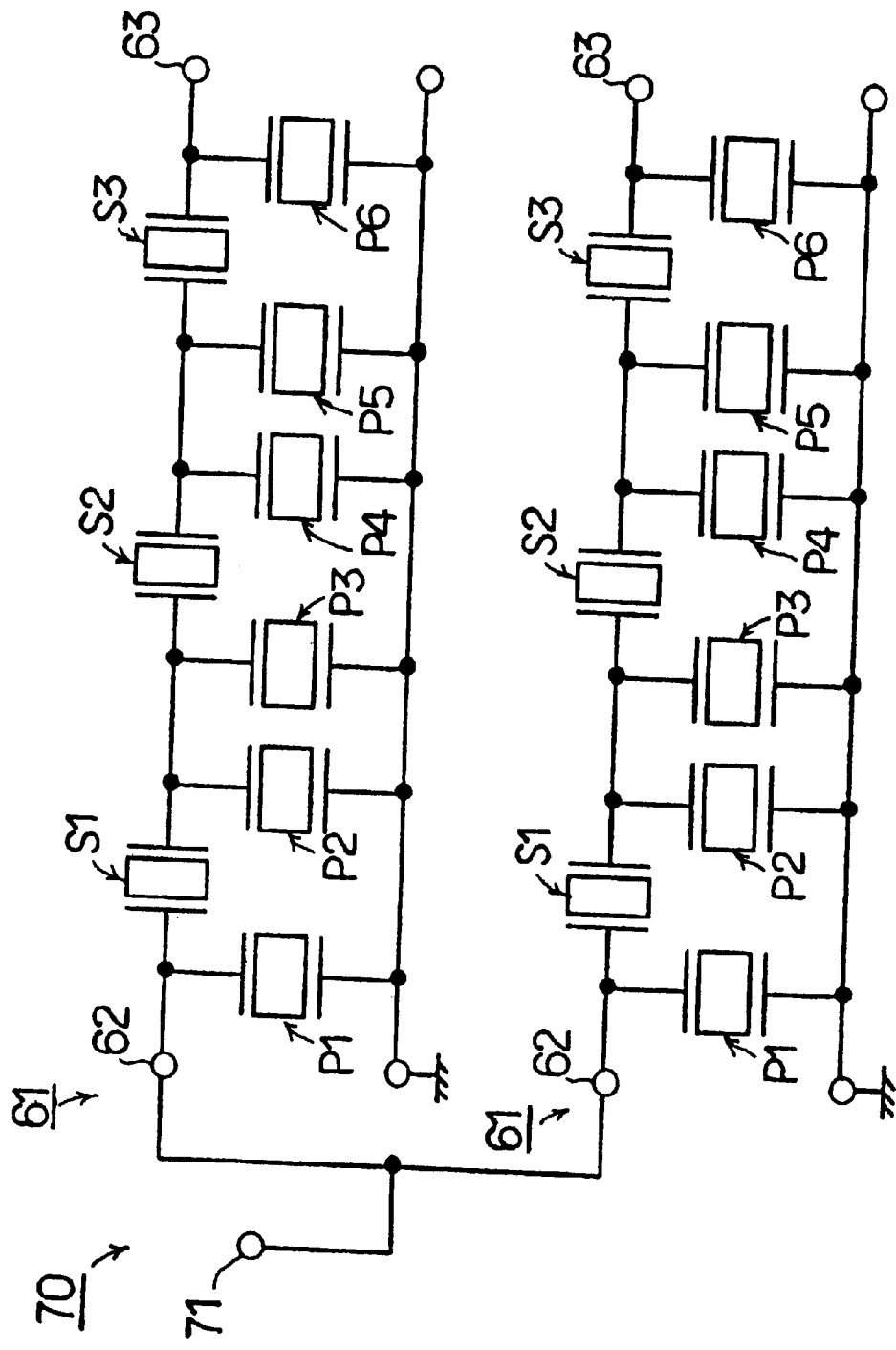
FIG. 14 is a schematic construction showing a preferred embodiment of an antenna duplexer constructed by using a surface acoustic wave filter according to other preferred embodiments of the present invention.
Figure 15:
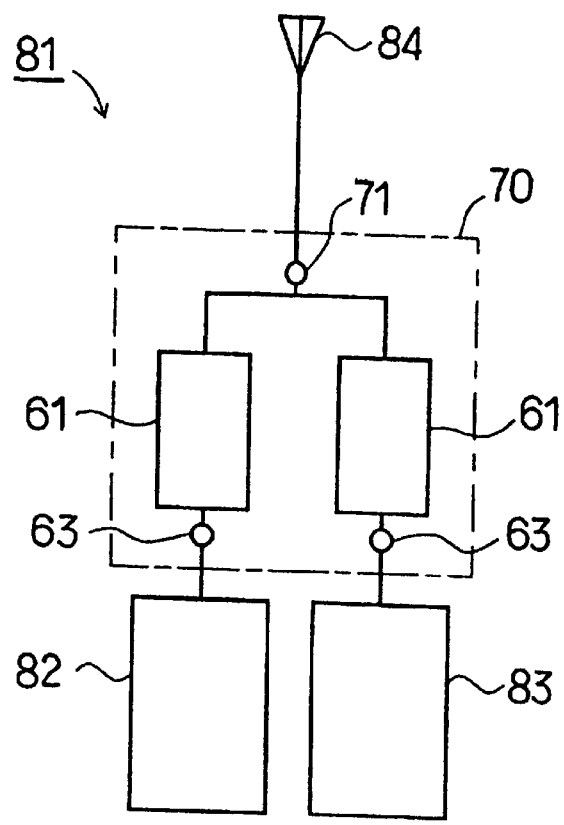
FIG. 15 is a schematic block diagram of a communication device constructed by using an antenna duplexer according to a preferred embodiment of the present invention.
Figure 16:
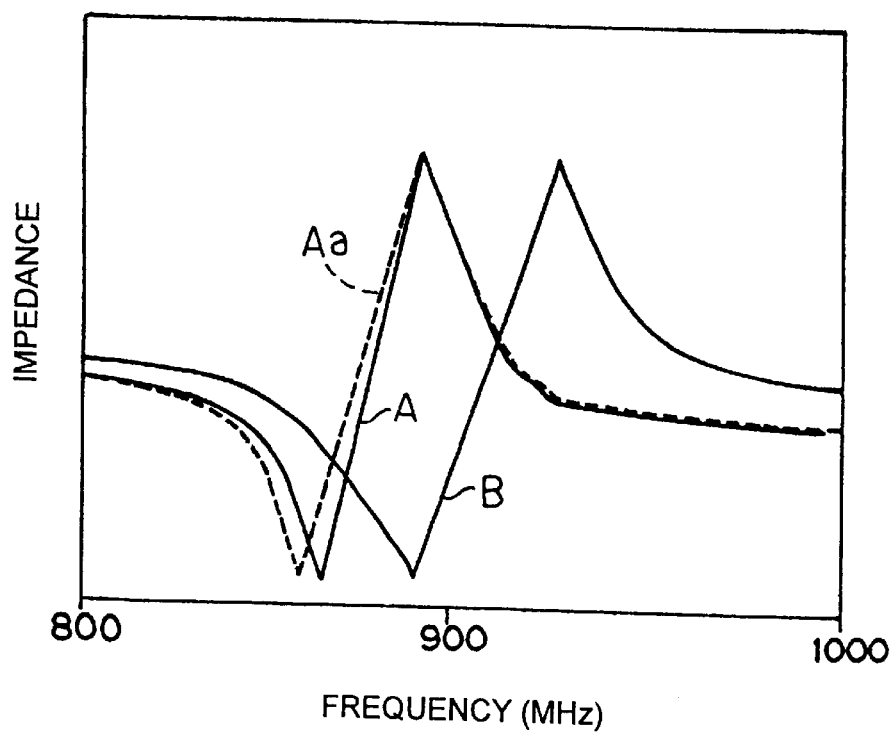
FIG. 16 shows the impedance-frequency characteristic of a resonator in a conventional surface acoustic wave filter.
Figure 17:
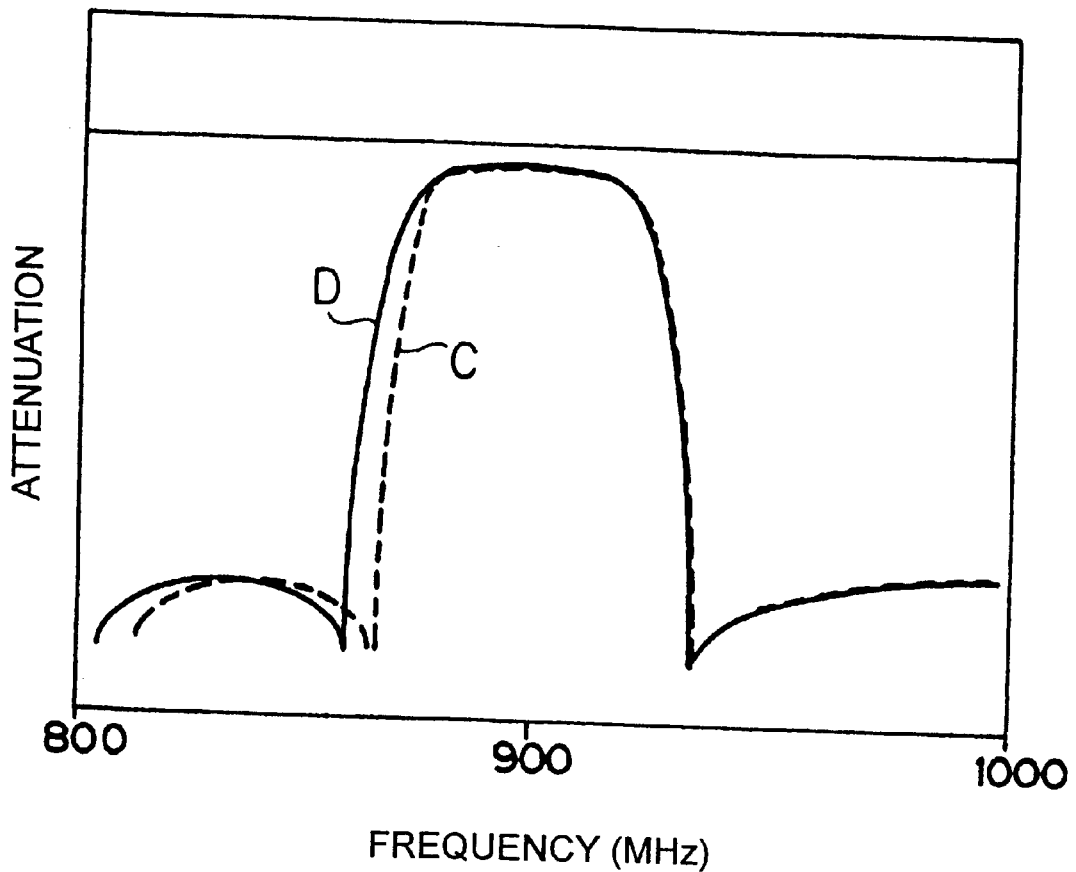
FIG. 17 shows the attenuation-frequency characteristic of a surface acoustic wave filter of a conventional ladder-type circuit construction.

As clearly seen when the characteristics shown by the solid and broken lines in FIG. 13 are compared, because a DC voltage is applied to the series-arm resonator and the resonant frequency of the series-arm resonator 31a is increased as described above, it is understood that in the frequency characteristic of the entire filter, the steepness on the higher frequency side of the passband increases. This is because a voltage is applied between electrode fingers and the gaps between the electrode fingers are different from each other in the propagation direction of the surface wave.

Moreover, in the above first and second preferred embodiments, a surface acoustic wave filter element of a ladder-type circuit construction containing parallel-arm resonators and series-arm resonators was taken as an example and described, but the present invention can be also applied to various surface acoustic wave devices using a one-port surface acoustic wave resonator, for example, resonators, surface acoustic wave filters as a composite of resonator-type filters and one-port surface acoustic wave resonators, lattice-type filters, multiple mode surface acoustic wave resonator filters, etc, and by similarly applying a DC voltage between electrode fingers the improvement of the steepness and the frequency adjustment of filtering characteristics can be made.

Furthermore, when the electromechanical coupling coefficient before and after the application of voltage is substantially reduced beforehand by thinning out a portion of the interdigital transducers and by shifting the propagation direction of a surface wave from X axis according to conventional methods, a much greater effect of the advantages achieved by preferred embodiments of the present invention can be obtained.

Next, a preferred embodiment of an antenna duplexer constructed by using a surface acoustic wave filter according to other preferred embodiments of the present invention is described with reference to FIG. 13.

FIG. 13 is a circuit diagram for describing an antenna duplexer of the present preferred embodiment. In an antenna duplexer 70 of the present preferred embodiment, a pair of ladder-type filters which are the same as the ladder-type surface acoustic wave filter shown in FIG. 6, but in which the number of stages is different from that of the ladder-type surface acoustic wave filter shown in FIG. 6, are used. That is, the input terminals 62 of each of the ladder-type filters 61 which are commonly connected constitute a first port 71. On the other hand, the output terminals 63 of each of the ladder-type filters 61 are used as they are and constitute second and third ports of the antenna duplexer of the present preferred embodiment.

In this way, by using a pair of ladder-type filters 61 and 61, an antenna duplexer can be constructed.

Figure 12:
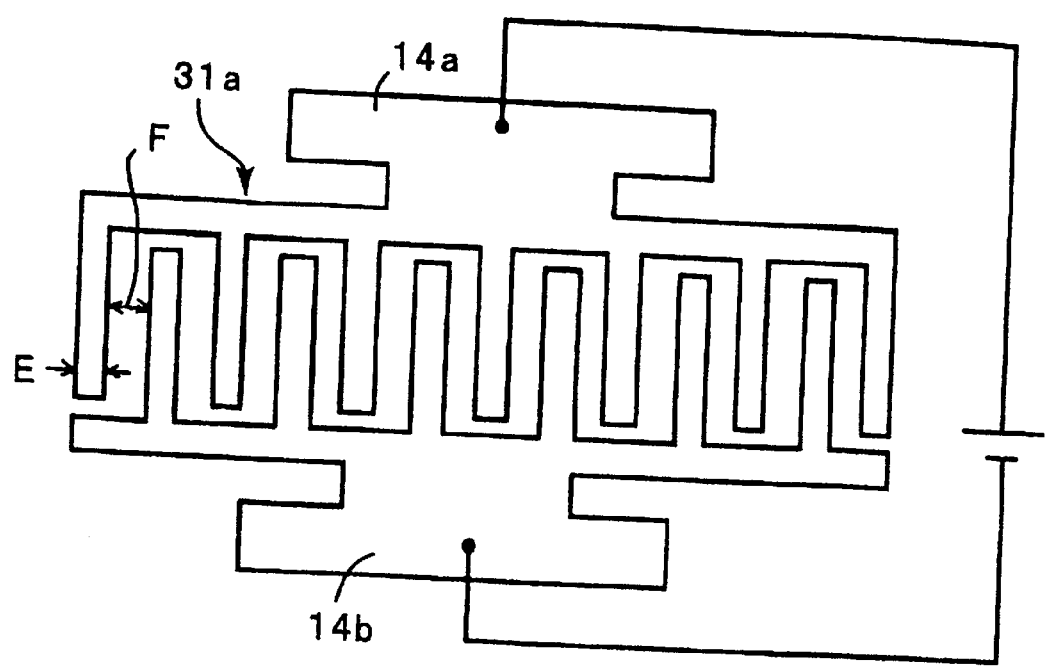
FIG. 12 is a typical enlarged top view for illustrating the process for applying a DC voltage to a series-arm resonator in the second preferred embodiment of the present invention.

Furthermore, by using the above antenna duplexer, a communication device can be constructed, and one example of such a communication device is shown in FIG. 12.

In a communication device 81 of the present preferred embodiment, an antenna duplexer 70, and transmission or reception circuits 82 and 83 are provided. A first port 71 of the antenna duplexer 70 is connected to an antenna 84, and output terminals 63 constituting second and third ports are connected to the transmission or reception circuits 82 and 83.

In this antenna duplexer 70, the pair of ladder-type filters 61 are preferably constructed so that their passband is different from each other, and because of that the antenna 84 can be used as an transmission antenna and reception antenna.

While preferred embodiments of the present invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:

a piezoelectric substrate made of $LiTaO_3$; and at least one interdigital transducer disposed on the piezoelectric substrate and having a plurality of electrode fingers; wherein a polarization direction in at least one gap portion between the electrode fingers of the at least one interdigital transducer is different from a polarization direction in other gap portions between electrode fingers on the same propagation path.

2. A surface acoustic wave device as claimed in claim 1, wherein a portion of the electrode fingers of the at least one interdigital transducer are withdrawn.

3. A surface acoustic wave device as claimed in claim 1, wherein the propagation direction of a surface acoustic wave in at least one of the interdigital transducers is different from the propagation direction of other interdigital transducers.

4. A surface acoustic wave device as claimed in claim 1, wherein the piezoelectric substrate is a $LiTaO_3$ substrate.

5. A duplexer comprising a surface acoustic wave device as claimed in claim 1.

6. A communication device comprising a surface acoustic wave device as claimed in claim 1.

7. A surface acoustic wave filter comprising:

a piezoelectric substrate; and a plurality of one-port surface acoustic wave elements provided on the substrate and each having an interdigital transducer, the plurality of one-port surface acoustic wave elements being arranged to define a ladder-type circuit having at least one parallel-arm resonator and at least one series-arm resonator;

wherein a polarization direction in at least one gap portion between the electrode fingers in the interdigital transducer of one of the one-port surface acoustic wave elements is different from a polarization direction in other gap portions between the electrode fingers.

8. A surface acoustic wave filter as claimed in claim 7, wherein a portion of the electrode fingers of the at least one interdigital transducer are withdrawn.

9. A surface acoustic wave filter as claimed in claim 7, wherein the propagation direction of a surface acoustic wave in at least one of the interdigital transducers is different from the propagation direction of other interdigital transducers.

10. A surface acoustic wave filter as claimed in claim 7, wherein the piezoelectric substrate is a $LiTaO_3$ substrate.

11. A duplexer comprising a surface acoustic wave filter as claimed in claim 7.

12. A communication device comprising a surface acoustic wave filter as claimed in claim 7.

13. A surface acoustic wave resonator filter comprising:

a piezoelectric substrate; and a plurality of interdigital transducers provided on the piezoelectric substrate and including a plurality of electrode fingers;

wherein a polarization direction in at least one gap portion between electrode fingers in the interdigital transducer of one of the one-port surface acoustic wave elements is different from a polarization direction in other gap portions between the electrode fingers.

14. A surface acoustic wave resonator filter as claimed in claim 13, wherein a portion of the electrode fingers of the at least one interdigital transducer are withdrawn.

15. A surface acoustic wave resonator filter as claimed in claim 13, wherein the propagation direction of a surface acoustic wave in at least one of the interdigital transducers is different from the propagation direction of other interdigital transducers.

16. A surface acoustic wave resonator filter as claimed in claim 13, wherein the piezoelectric substrate is a $LiTaO_3$ substrate.

17. A duplexer comprising a surface acoustic wave resonator filter as claimed in claim 13.

18. A communication device comprising a surface acoustic wave resonator filter as claimed in claim 13.

19. A method of manufacturing a surface acoustic wave device comprising the steps of:

providing a piezoelectric substrate;

forming at least one interdigital transducer having a plurality of electrode fingers on the piezoelectric substrate;

wherein the step of forming at least one interdigital transducer on the piezoelectric substrate includes a step of applying a DC voltage so that an electric field strength of about 50 V/$\mu$m or more is applied to the at least one interdigital transducer such that a polarization direction in at least one gap portion between the electrode fingers is changed to be different from a polarization direction in other gap portions.

20. A method according to claim 19, wherein a frequency adjustment is performed by applying the DC voltage.

* * * * *